United States Patent
Lim et al.

(10) Patent No.: US 9,557,756 B2
(45) Date of Patent: Jan. 31, 2017

(54) BIAS DRIFT COMPENSATION

(71) Applicant: Infineon Technologies AG, Neubiberg (DE)

(72) Inventors: Cheow Guan Lim, Singapore (SG); Yong Siang Teo, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 31 days.

(21) Appl. No.: 14/618,216

(22) Filed: Feb. 10, 2015

(65) Prior Publication Data

US 2016/0231757 A1    Aug. 11, 2016

(51) Int. Cl.
| | |
|---|---|
| G05F 1/46 | (2006.01) |
| G01R 19/10 | (2006.01) |
| H03M 1/34 | (2006.01) |
| H03M 1/10 | (2006.01) |

(52) U.S. Cl.
CPC ............... *G05F 1/468* (2013.01); *G01R 19/10* (2013.01); *H03M 1/1023* (2013.01); *H03M 1/34* (2013.01)

(58) Field of Classification Search
CPC .................................................... G01R 35/005
See application file for complete search history.

(56) References Cited

U.S. PATENT DOCUMENTS

| | | | | |
|---|---|---|---|---|
| 5,153,837 A | * | 10/1992 | Shaffer | G06Q 50/06 324/103 R |
| 5,814,903 A | * | 9/1998 | Wu | H02J 1/108 244/172.7 |
| 6,515,464 B1 | * | 2/2003 | Darmawaskita | H03F 3/45977 324/601 |
| 7,075,465 B2 | * | 7/2006 | Jonsson | H03M 1/1061 341/118 |
| 2003/0151450 A1 | * | 8/2003 | Nguyen | G06F 1/26 327/540 |

* cited by examiner

*Primary Examiner* — Clayton E Laballe
*Assistant Examiner* — Noam Reisner
(74) *Attorney, Agent, or Firm* — Shumaker & Seiffert, P.A.

(57) ABSTRACT

Representative implementations of devices and techniques provide detection of a voltage drift of an electrical component or system. A detection circuit detects the voltage drift based on a comparison of a received signal from a test circuit and a reference voltage. A compensation voltage may be generated and applied at one or more locations within the test circuit to compensate for the voltage drift.

25 Claims, 16 Drawing Sheets

BIAS DRIFT COMPENSATION

BACKGROUND

Many decision-based systems work within a specified voltage domain. For example, for the purposes of logical decision making, portions of the voltage domain may be assigned to a logical high while other portions of the voltage domain are assigned to a logical low. In other words, a particular voltage appearing at a decision node can be interpreted by the system as a logical high or a logical low, based on the assignment of voltage values within the voltage domain.

Within today's systems, voltage domains can be quite narrow, encompassing only a few volts, for example. In some cases, sub-systems work with different voltage domains, or at a different voltage bias, having to convert signals from one domain to another domain to preserve the logic, as the signals pass from sub-system to sub-system. In these and other examples, the integrity of the logical decisions of a system relies on the constancy of the voltage domains.

However, in many cases, a system voltage source may generate several voltage domains, sometimes with different voltage bias. Over time, and often due to environmental conditions, the voltages of the domains or the voltage bias of devices or systems can drift differently or unequally. Such an occurrence can result in incorrect or unreliable logical decisions, as when the system interprets a voltage appearing at a decision node incorrectly, or as when a pair of unequally effected signals appears at the input of a comparison or decision device.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

FIG. 15 represents an initial start-up state of the circuit, according to an implementation.

FIG. 16 represents a pre-calibration state of the circuit, according to an implementation.

FIG. 17 represents a calibration of the circuit, according to an implementation.

FIG. 18 represents a normal operational state of the circuit after calibration, according to an implementation.

DETAILED DESCRIPTION

Overview

Figure 1:
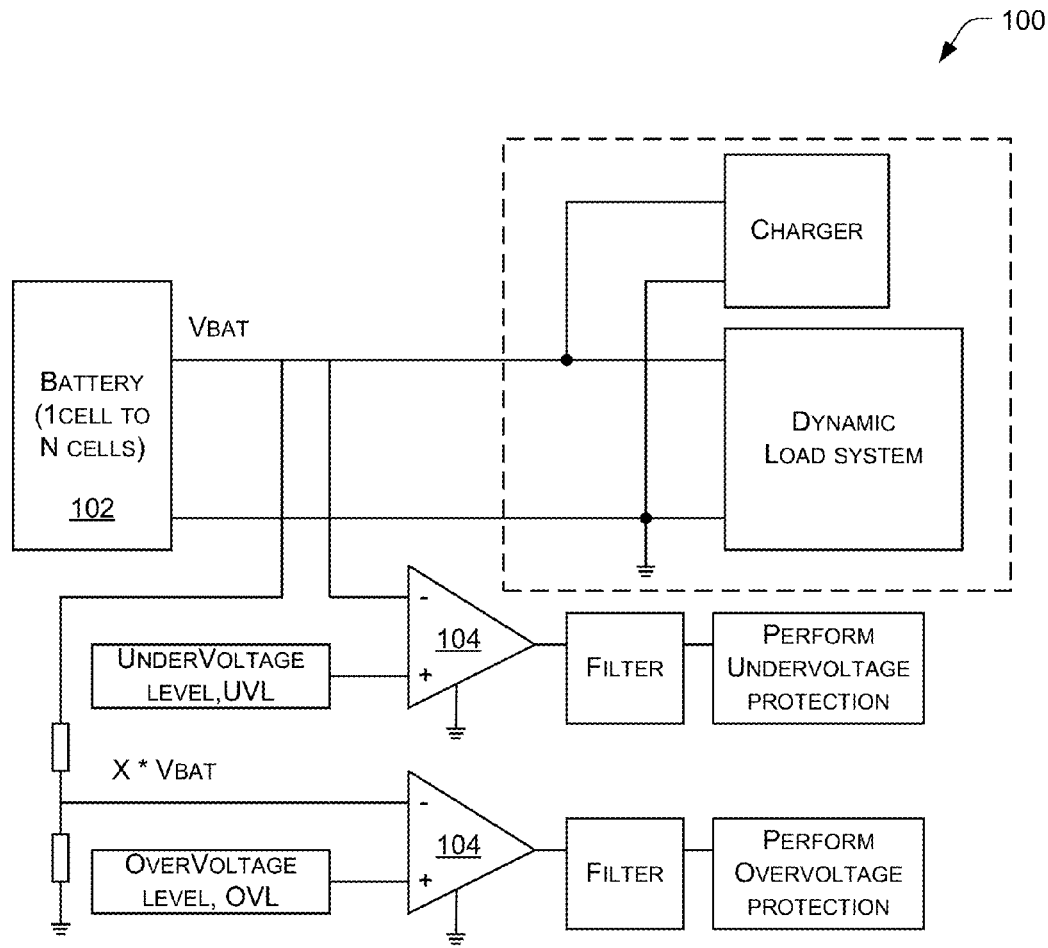
FIG. 1 is a schematic block diagram of an example battery charging circuit, which illustrates an environment wherein the techniques and devices described herein may be implemented, according to various implementations.

Representative implementations of devices and techniques provide detection of a voltage drift of an electrical component or system. In various implementations, a detection circuit detects the voltage drift based on a comparison of one or more received signals. For example, received signals may originate from a test circuit, a reference voltage, or the like. A compensation voltage may be generated by a calibration circuit and applied at one or more locations within the test circuit to compensate for the voltage drift. In one implementation, the compensation voltage is applied at an output of the test circuit. In an alternate implementation, the compensation voltage is applied at a reference voltage input of a comparison circuit. In other implementations, the compensation voltage (or a proportional form of the compensation voltage) may be applied at various other nodes of a system or circuit.

In one implementation, the calibration circuit is arranged to adjust (i.e., restore) a logical decision voltage level of a comparison circuit, via the compensation voltage. For example, the logical decision voltage can be restored when a compensation voltage matches or offsets the voltage drift of the inputs to the circuit, preserving the logical decision level.

In another implementation, the calibration circuit generates the compensation voltage based on sensing a change of logical state of the decision output. For example, in one implementation, the calibration circuit generates a varying voltage that sweeps from a first voltage value through successively higher voltage values until a logical state change is detected from an output of the comparison circuit. In the example, a voltage value of the varying voltage at the detection of the logical state change comprises or becomes the compensation voltage value.

In various implementations, an arrangement for detecting and/or compensating for voltage drift within the system can include a detection portion comprising a comparison circuit and a calibration portion arranged to compensate for the detected voltage drift. In the implementations, the arrangement can automatically perform detection and/or calibration at user defined intervals during normal operation of the system, at start-up or initialization of the system, or at other convenient times. In one implementation, the arrangement records output values at key nodes prior to commencing calibration, so that the system can proceed with normal operations during calibration with unaffected node values.

Various implementations and techniques for detecting and/or compensating for voltage drift are discussed in this disclosure. Techniques and devices are discussed with reference to example devices, circuits, and systems illustrated in the figures. The techniques and devices are discussed with reference to operational amplifiers, comparators, analog-to-digital converters (ADC), and the like. However, this is not intended to be limiting, and is for ease of discussion and illustrative convenience. The techniques and devices discussed herein may be applied to any of various components, circuits, circuit designs, structures, systems, etc., while remaining within the scope of the disclosure.

Implementations are explained in more detail below using a plurality of examples. Although various implementations and examples are discussed here and below, further implementations and examples may be possible by combining the features and elements of individual implementations and examples.

Example Environment

FIG. 1 is a schematic block diagram of an example battery charging circuit 100, illustrating an environment wherein the techniques and devices described herein may be implemented, according to various implementations. In the example circuit 100, the battery voltage Vbat is applied to the protection circuits and devices, which include an under-voltage leg and an overvoltage leg. However, as shown in FIG. 1, some of the voltages used by the protection circuits and devices are fractions of the battery voltage (note the voltage divider feeding the overvoltage leg. Consequently, there is likely more than one voltage domain for logic decisions within the circuit 100.

Throughout the lifetime of the battery 102, the voltage Vbat can vary within a significant range (e.g., 2.7V to 4.15V, for example). As a result, the protection circuits are used to ensure that there is sufficient voltage output for operation of the attached system and also to ensure protection to the attached system should the battery voltage Vbat get too high. However, voltage drift within the protection devices (such as the comparators 104) can occur unevenly. For example, the difference in the input voltages of the comparators 104 can cause an uneven aging in the input devices of the comparators 104. This uneven aging can eventually cause an input offset, and result in erroneous logic decisions by the comparators 104.

For example, the under-voltage leg of the protection circuits uses the comparator 104 of the under-voltage leg to ensure that the battery voltage is greater than a predetermined low-voltage threshold UVL (Vbat>UVL). For instance, under-voltage protection compensation (such as boosting the voltage) may be enabled (e.g., logical decision) when an output voltage of the comparator 104 is a logical high, indicating that Vbat is less than the predetermined voltage UVL. Additionally, the overvoltage leg of the protection circuits uses the comparator 104 of the overvoltage leg to ensure that a fraction of the battery voltage (x*Vbat) does not exceed a predetermined overvoltage threshold OVL. For instance, overvoltage protection compensation (such as shunting the voltage) may be enabled (e.g., logical decision) when an output voltage of the comparator 104 is a logical high, indicating that the voltage x*Vbat (where x=0.5, in one example) is equal to or greater than the predetermined voltage UVL. Should the bias voltage of the input devices of the comparators 104 drift too much (due to uneven aging or other causes), the logical decisions of the comparators 104 may be affected, producing erroneous results, and causing undesirable effects to systems relying on the charging system circuit 100. In many cases, a voltage shift of a transistor device can occur differently over time when different voltages are applied to the inputs. The voltage shift of the transistor device could be due to a drift in the threshold voltage. The amount of the threshold voltage drift is dependent on the bias voltage over its operation lifetime.

Figure 2:
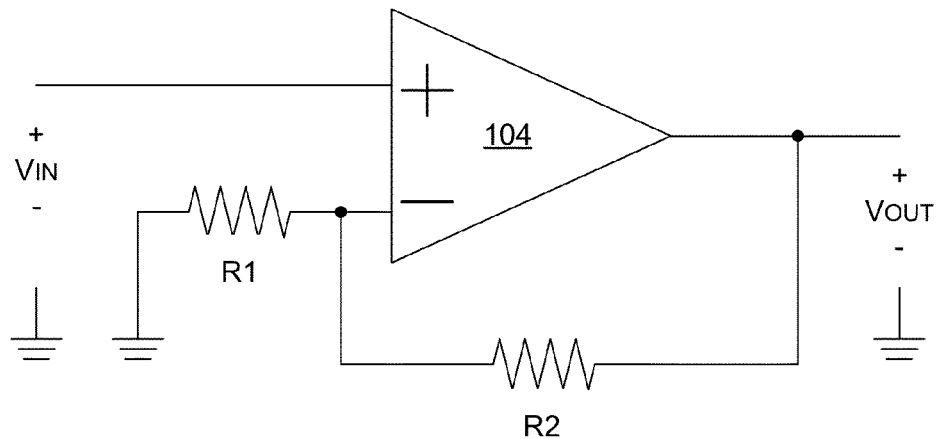
FIG. 2 is a schematic block diagram of an example operational amplifier (op-amp), a portion of the circuit of FIG. 1 wherein the techniques and devices described herein may be implemented, according to an implementation.

Referring to FIG. 2, when an operational amplifier (op-amp) is designed for use in an application, such as the comparator 104 of FIG. 1, or the like, even if it is calibrated within the original design, over time and a variety of input voltage conditions, the output voltage of the op-amp 104 can drift and cause issues within the system in which it is applied. In an application, when the output of the op-amp 104 is expected to be a voltage value Vout, over time, the output voltage can drift to Vout+ΔVout.

Figure 3:
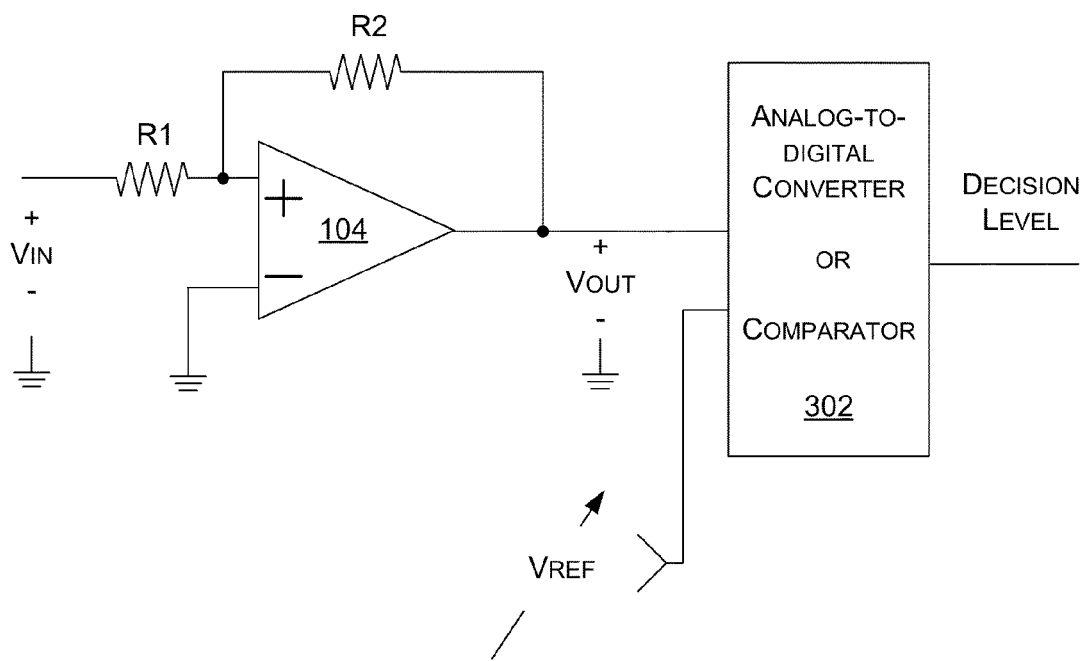
FIG. 3 is a schematic block diagram of the op-amp of FIG. 2, including a comparison circuit, according to an implementation.

FIG. 3 illustrates an example application of an op-amp 104 used to make logical decisions based on an output voltage of the op-amp 104. In such an application, a comparison circuit 302 may be used to compare the output Vout of the op-amp 104 to a reference voltage Vref to determine a logical decision level. In an example, the voltage Vout may have drifted sufficiently great to trigger a wrong decision level by the comparison circuit 302.

Referring to FIG. 3, it is possible to calibrate the variable reference voltage Vref during production testing to compensate for drift due to process corners and device mismatch. Additionally, mitigation efforts such as thermal acceleration testing can help to predict the expected drift of a device, as detailed above. The expected error can be taken into consideration when setting the decision level for the Vref, for example. However, the design of FIG. 3 does not allow for dynamic calibration of the device to compensate for later drift due to aging, operating temperatures, and input variations. Further, overcompensation may occur when attempting to mitigate predicted drift, which might introduce more decision error to the system. In similar applications, the op-amp 104 may be operating within a 3.3V domain, and the remainder of the circuit may be operating within a voltage domain of 2.5V. In such applications, voltage drift can be a more complex issue, as described above.

Example Detection/Compensation Techniques

In an implementation, one or more constructed circuits or an arrangement can be implemented to provide planned checking for voltage drift of a circuit or component, such as the op-amp 104 (i.e., circuit under test, or "test circuit"). In another implementation, the arrangement provides for automatic tuning and calibration of the test circuit to dynamically compensate for drift effects.

Figure 4:
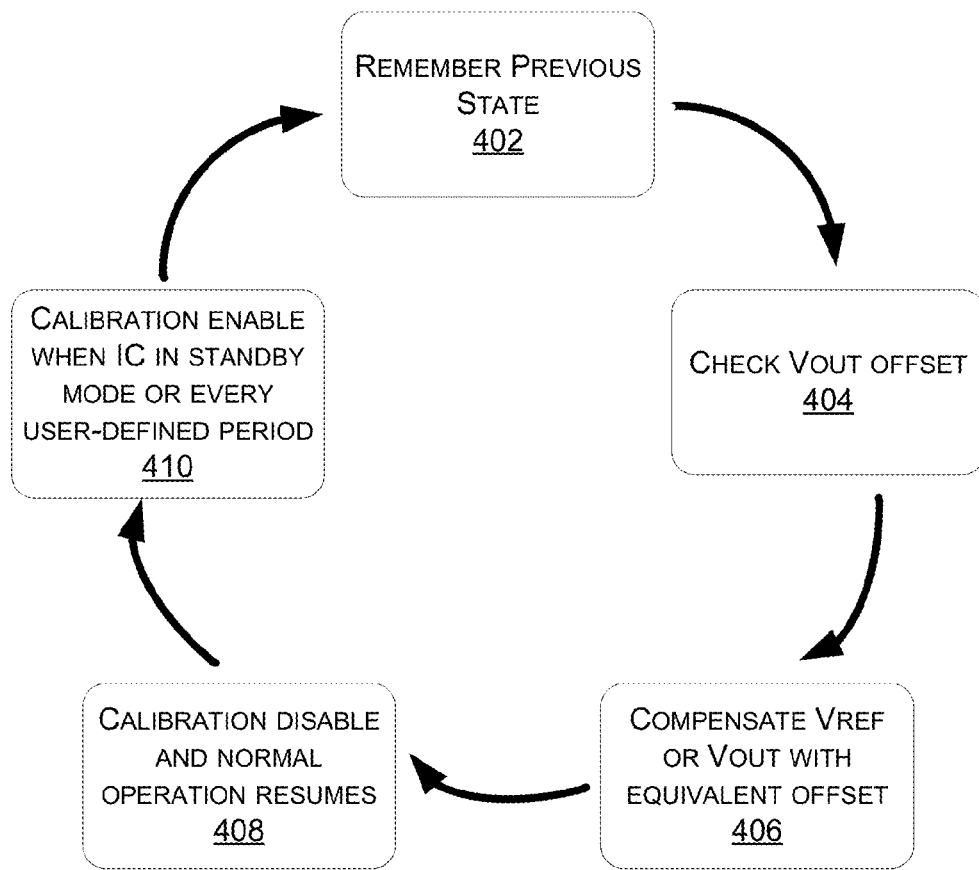
FIG. 4 is a flow diagram of an example auto-calibration process, according to an implementation.

Referring to FIG. 4, a flowchart shows an example auto-calibration process, according to an implementation. As shown at block 402, in an implementation, the process includes remembering the output state of the test circuit prior to commencing calibration of the test circuit. For example, referring to FIG. 3, the process includes remembering the output state of the comparison circuit 302 (e.g., the comparator or the ADC). This ensures that the system can continue to operate, and do so normally, during the calibration process. In an implementation, the output state of the comparison circuit 302 can be stored in a memory storage device, digital logic, or the like.

Figure 5:
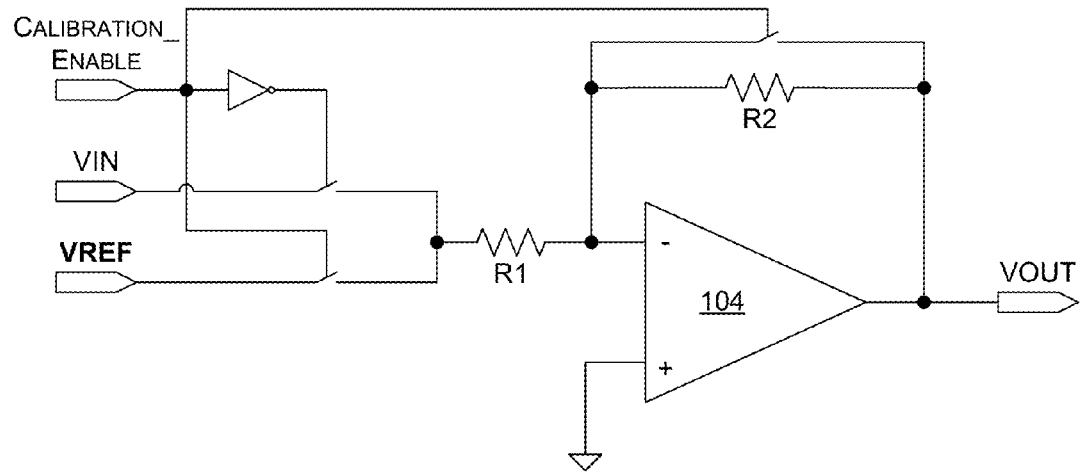
FIGS. 5 and 6 are schematic block diagrams of the op-amp circuit of FIG. 2, illustrating examples of offset detection, according to implementations.
Figure 6:
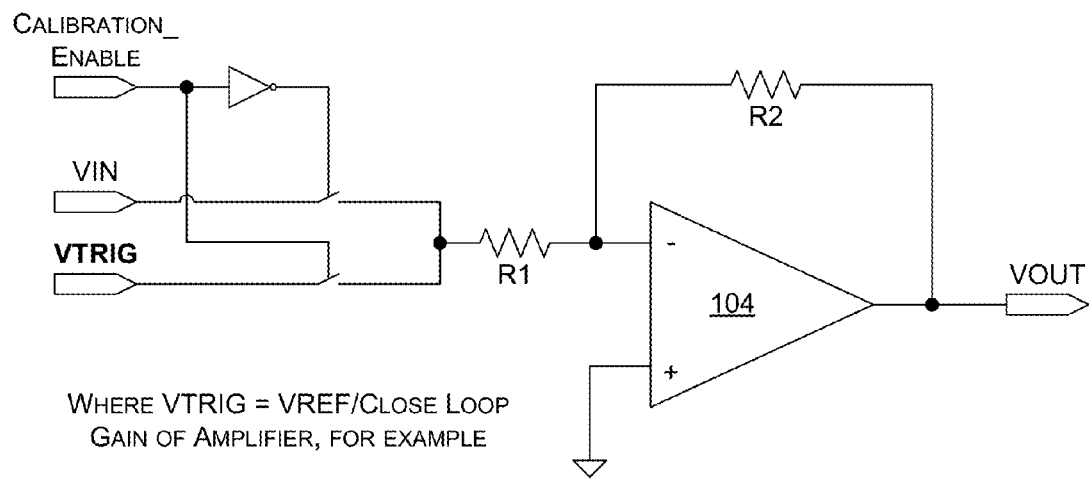

At block 404, the Vout of the op-amp 104 is checked for any offset. For instance, a Vout offset may be an indication of an offset (voltage drift) at the input of the op-amp 104 due to aging, etc. Various techniques may be used to check for voltage drift in various implementations. For example, in one implementation, the input of the op-amp 104 can be forced to a known voltage at the start of the calibration (such as the reference voltage Vref, for instance). These techniques are shown in FIG. 5. Alternately, a known input voltage that is proportional to Vref can also be used as the input voltage to the op-amp 104, as shown in FIG. 6. In another example, the gain of the op-amp 104 can be forced to unity gain (as shown in FIG. 5).

With each of these techniques, the input voltage and the output voltage are known or predictable. Any voltage difference, variance, or offset at the output from the expected output voltage can be an indication of voltage drift due to the internal devices (e.g., due to aging, etc.) of the op-amp 104. In an implementation, a comparison circuit (such as the comparison circuit 302, for example) is arranged to receive the output voltage of the test circuit (e.g., the op-amp 104) and to compare it to a reference voltage to detect a bias voltage drift (via level check circuit 704, shown in FIG. 7, for instance) as further described below.

Figure 7:
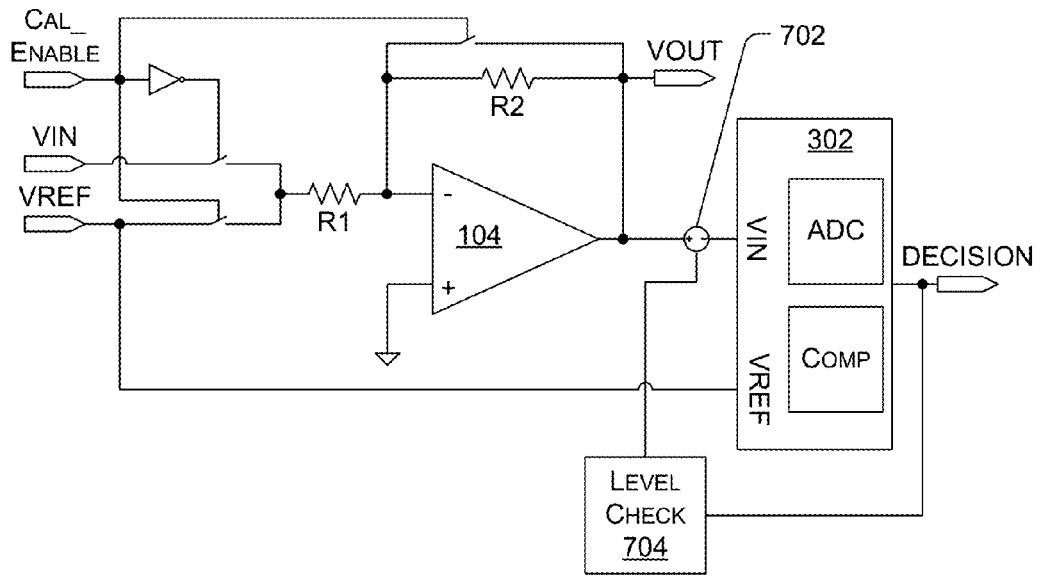
FIGS. 7 and 8 are schematic block diagrams of the op-amp circuit of FIG. 2, including detection and calibration circuits, illustrating examples of calibration techniques, according to implementations.
Figure 12:
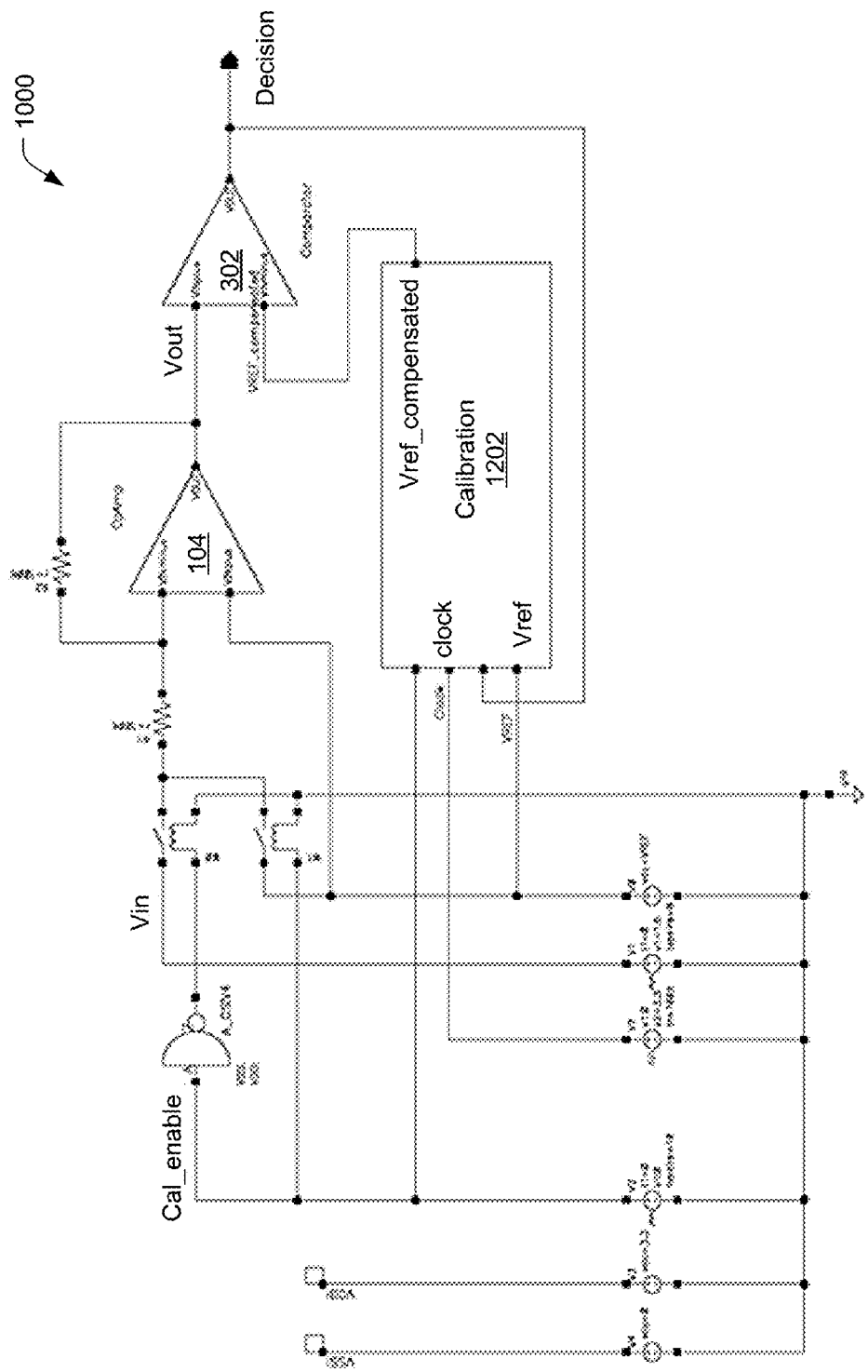
FIG. 12 is a schematic diagram of one example implementation of the detection and calibration circuit of FIG. 11.

At block 406, when an offset is detected indicating a voltage drift (e.g., by level check 704, as shown in FIG. 7, for example), a calibration may be automatically performed (using a calibration circuit, such as the level check 704 or the calibration circuit 1202, shown in FIG. 12, for example). During the calibration, a compensation voltage is generated that has an equivalent voltage to the offset detected. The compensation voltage is applied to one or more portions of the system or circuit to compensate for the voltage drift. For example, in an implementation as shown in FIG. 7, the compensation voltage (illustrated as a variable DC voltage source 702) is applied to the output of the op-amp 104. In the example, the output Vout as biased by the compensation voltage restores the voltage value at the Vin input to the comparison circuit 302 to a level that is approximately equal to the level of Vin prior to the voltage drift.

Figure 8:
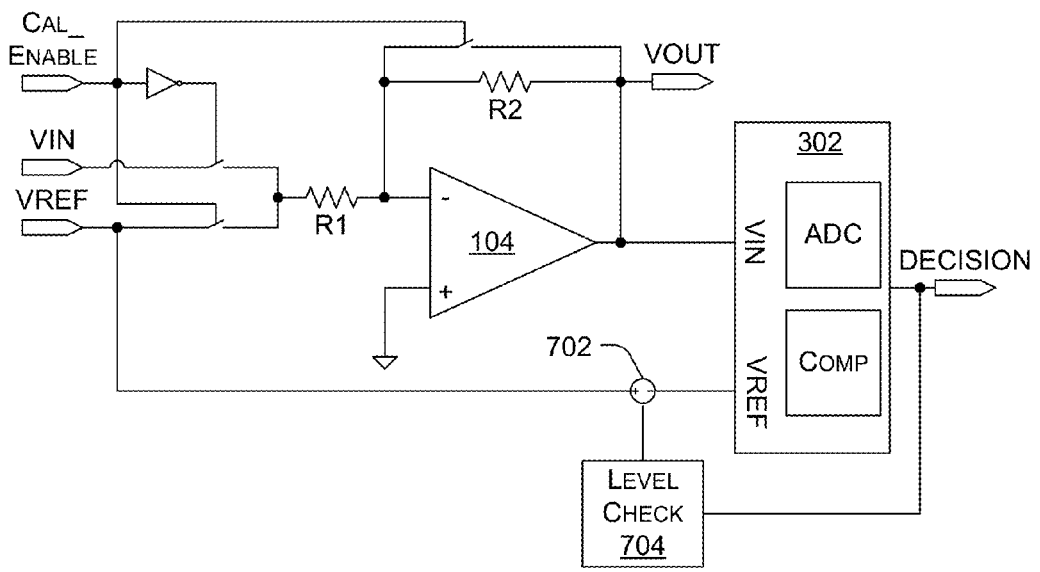

In another implementation as shown in FIG. 8, the compensation voltage (illustrated as the variable DC voltage source 702) is applied to the Vref input of the comparison circuit 302. In the implementation, the value of the reference voltage is adjusted (e.g., biased) to match the offset of the voltage at the Vin input to the comparison circuit 302. With the Vref signal biased to the same level as the offset of the output of the op-amp 104, the logical decision voltage of the comparison circuit 302 can operate at the predetermined level.

At block 408, once the decision logic is operating at the predetermined level, the calibration process is stopped and disabled, allowing normal operation to resume. At block 410, the process is repeated at user-defined intervals and/or at power-up or standby power of the system. In an implementation, if the offset voltage is greater than the calibrated range, a warning signal is output from the calibration circuits.

Based on the process described with reference to FIG. 4, the offset of the system is calibrated, including during normal operation of the system. The reliability and performance of the system is better controlled.

Example Implementations

Figure 9:
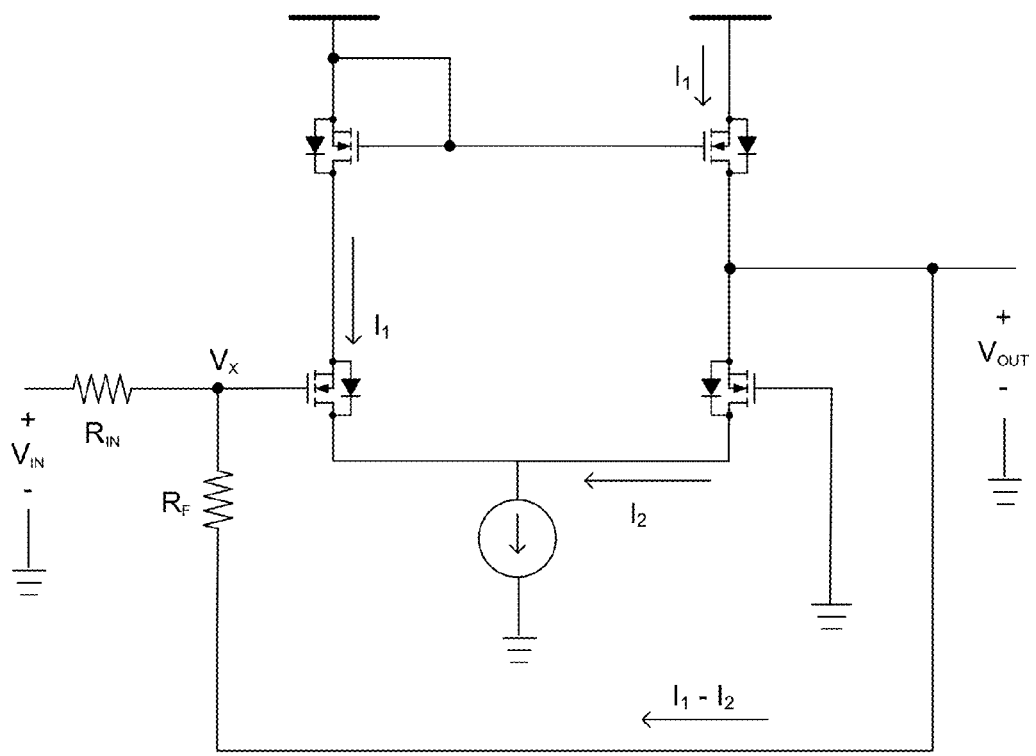
FIG. 9 is a transistor level schematic diagram of an inverter amplifier circuit, and illustrates voltage and current relationships of the circuit, according to an example.

Referring to FIG. 9, a transistor level schematic representation is shown, illustrating the voltage and current relationships of the inverter amplifier 104. Principles of the detection/calibration techniques described above may be discussed with reference to FIG. 9, for example.

In an implementation, the inverter amplifier 104 can be described with the following equations:

$$V_{out} = (I_1 - I_2) \cdot R_f + V_x$$

$$V_{in} = -(I_1 - I_2) \cdot R_{in} + V_x \quad \text{eq1} \rightarrow$$

$$(I_1 - I_2) = (V_x - V_{in})/R_{in} \quad \text{eq2} \rightarrow$$

Substituting eq2 into eq1, $$V_{out} = (V_x - V_{in}) \cdot R_f/R_{in} + V_x$$

$$V_{out} = -R_f/R_{in} \cdot V_{in} + (1 + R_f/R_{in}) \cdot V_x$$

$$I_1 = \frac{K'}{2} \cdot \frac{W}{L} (V_{in} - V_{t1})^2$$

$$I_1 = \frac{K}{2} \cdot (V_{in} - V_{t1})^2 \text{ where } K = K' \cdot \frac{W}{L}$$

$$eq3 \rightarrow V_x = \sqrt{\frac{2}{K} I_1} + V_{t1}$$

Taking the $I_1 - I_2$ current path, equation 1, $$V_{out} = -R_f/R_{in} \cdot V_{in} + (1 + R_f/R_{in}) \cdot \left( \sqrt{\frac{2}{K} I_1} + V_{t1} \right)$$

$$\Rightarrow V_{out} = -R_f/R_{in} \cdot V_{in} + (1 + R_f/R_{in}) \cdot \sqrt{\frac{2}{K} I_1} + (1 + R_f/R_{in}) \cdot V_{t1})$$

Figure 10:
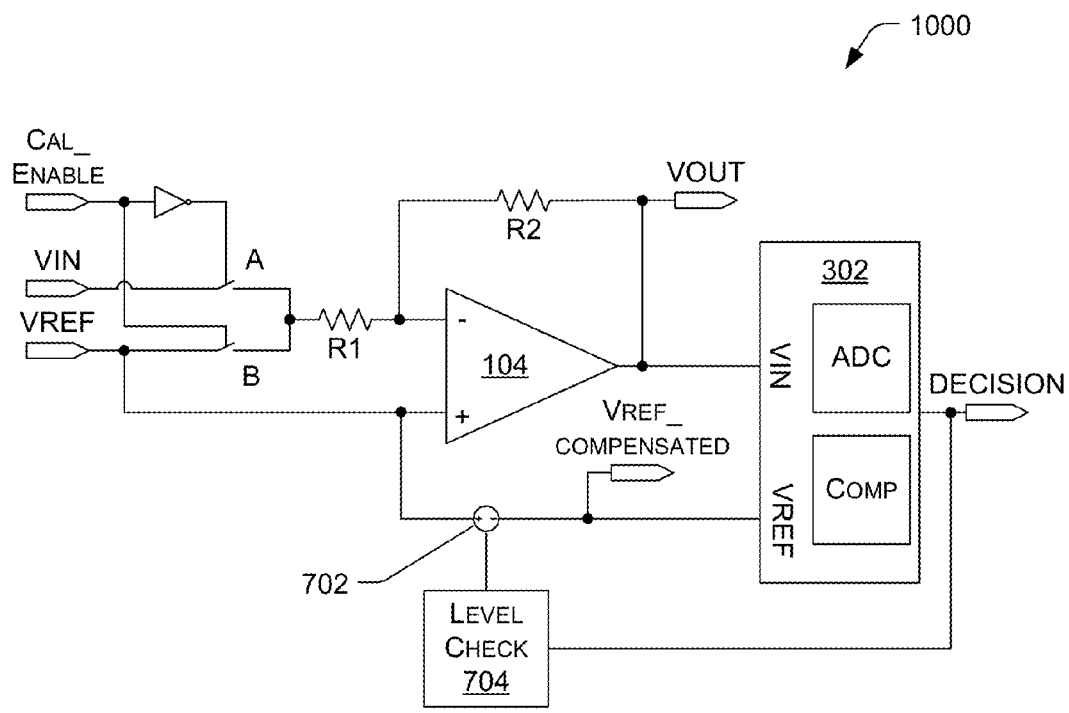
FIG. 10 is a schematic block diagram of a detection and calibration arrangement, according to an implementation.

Over a period of time, the threshold voltage may drift. As shown in FIG. 10, the drift can be compensated for in the next level comparison circuit 302 by adjusting the Vref_compensated value with an offset of $(1+R_f/R_{in}) \cdot V_{t1a}$ from the voltage value of Vref, so that the Vref_compensated reaches a voltage value where the decision level just triggers at the comparison circuit 302.

FIG. 10 is a schematic block diagram of a detection and calibration arrangement 1000, according to an implementation. In the implementation as shown in FIG. 10, enable circuits are used to switch the input of the arrangement 1000 from normal operation mode to offset detection mode. For example, switch A is closed during normal operation of the system represented by the op-amp 104 and any related circuits or systems (the system application of the op-amp 104, for example), and is opened during offset detection mode. Switch B is closed during offset detection mode and is open during normal operation of the system. The switching of switches A and B may be handled by the Cal_enable signal, which may be programmed to be active at user-defined intervals and/or at power-up and standby.

In an implementation as also shown in FIG. 10, the arrangement 1000 may include level check circuitry 704 arranged to detect the decision level and to generate and apply the compensation voltage (shown as voltage supply 702). In the implementation, the Vref_compensated signal comprises the Vref signal biased by the compensation voltage.

Figure 11:
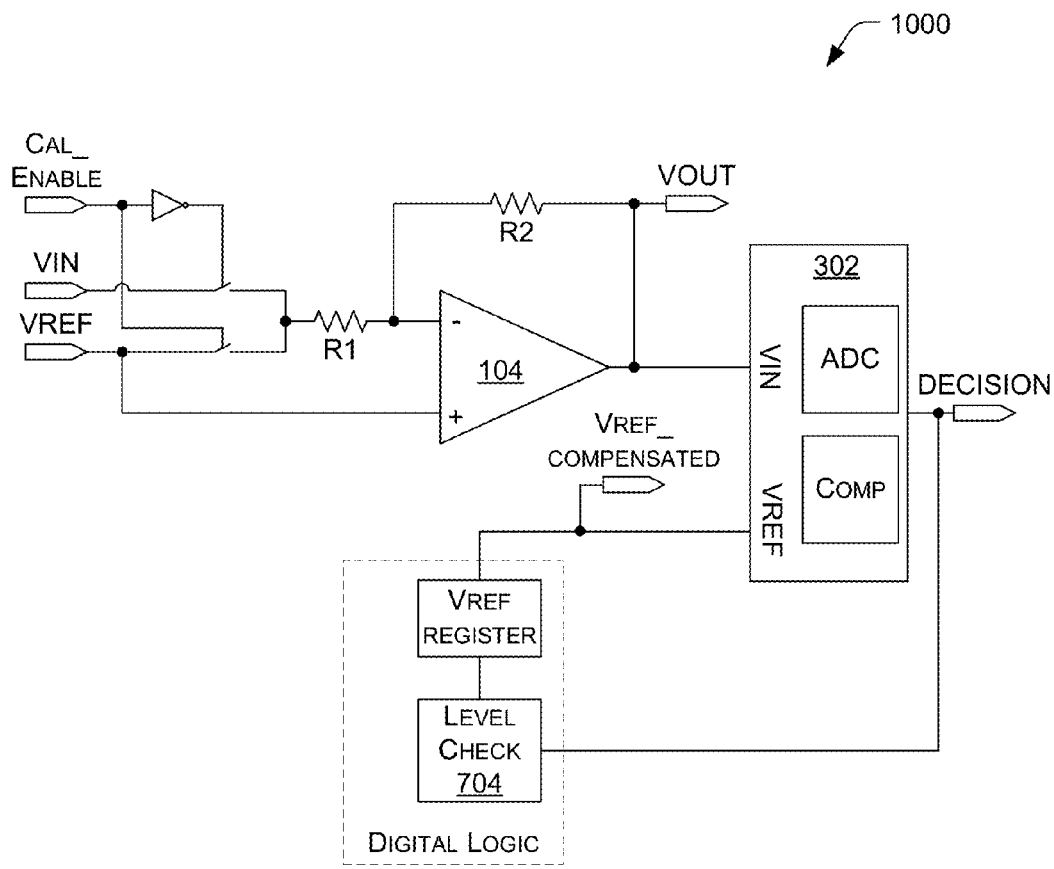
FIG. 11 is a schematic block diagram of a detection and calibration circuit including digital control logic, according to another implementation.

In an example, as shown in FIG. 11, the compensation voltage is digitally controlled. For example, when a decision level change over time is detected, the Vref_compensated setting (i.e., bias level) can be changed accordingly to re-adjust the decision level to the correct level. In an implementation, as also shown in FIG. 11, the digital control logic for the compensation voltage may include a memory storage register arranged to store a current (or previous) logical output state (i.e., decision level) of the comparison circuit 302 prior to commencing a calibration of the test circuit (e.g., op-amp 104), allowing the test circuit to operate normally during calibration.

FIG. 12 is a schematic diagram of one example implementation of the detection and calibration arrangement 1000 of FIGS. 10 and 11. In an implementation, the arrangement 100 includes a test circuit (e.g., op-amp 104) arranged to receive an input voltage Vin and to output an output voltage Vout. The arrangement 1000 further includes a comparison circuit 302 arranged to receive the output voltage Vout of the test circuit 104 and to compare it to a reference voltage Vref, and to output a decision signal ("decision") based on the comparison. In the implementation, the arrangement 1000 includes a calibration circuit 1202 arranged to receive the decision signal and to output a compensation voltage Vref_compensated. In various examples, the compensation voltage is applied to the output voltage Vout of the test circuit 104 or to the reference voltage Vref (as shown in FIG. 12), to compensate for a voltage drift of the test circuit 104.

In an implementation, the output Vout of the op-amp 104 is fed into the comparison circuit 302. When Vout is higher than the Vref_compensated signal, the output "decision" will show logic high. In other implementations, other arrangements and logic levels may be used to enable the calibration process.

Figure 13:
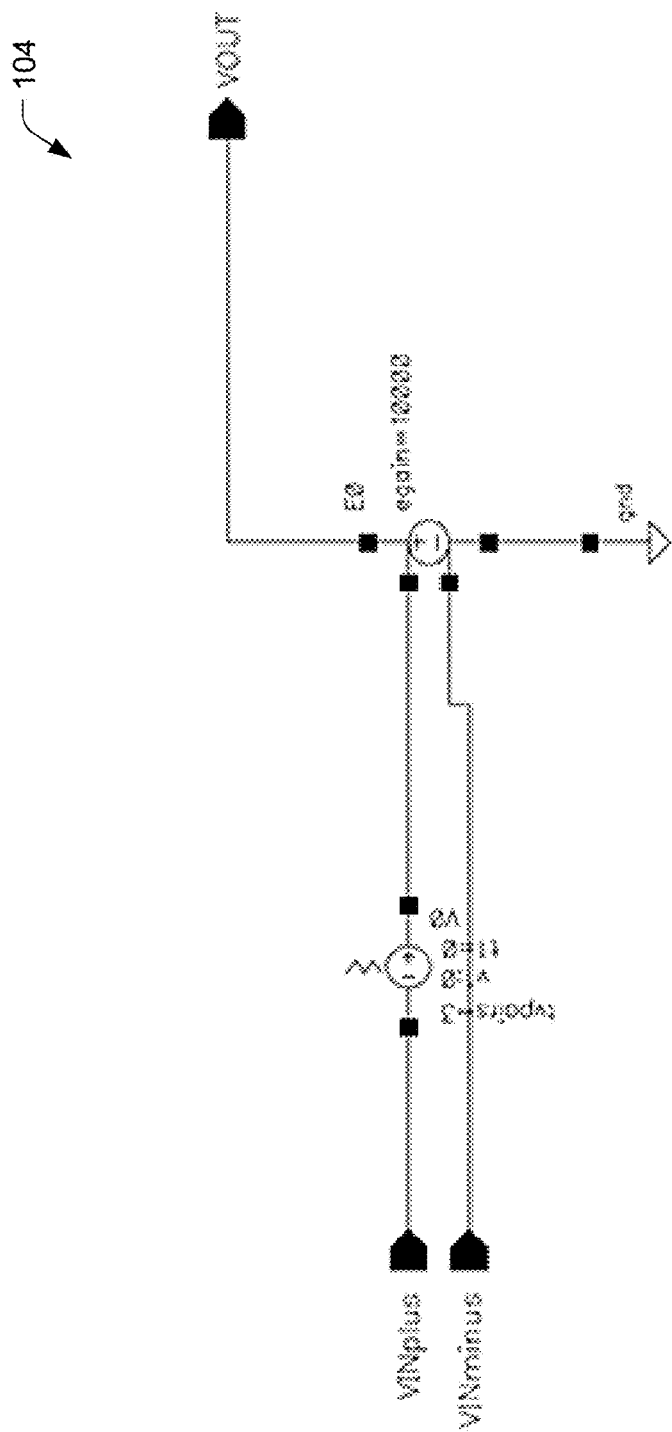
FIG. 13 is a schematic diagram of one example implementation of an op-amp, shown as an ideal voltage controlled voltage source.

FIG. 13 is a schematic diagram of one example implementation (or model) of an op-amp 104, shown as an ideal voltage controlled voltage source. In one implementation, the open loop gain of the voltage source is 10000. In other implementations, other models with other gain values may be used.

Figure 14:
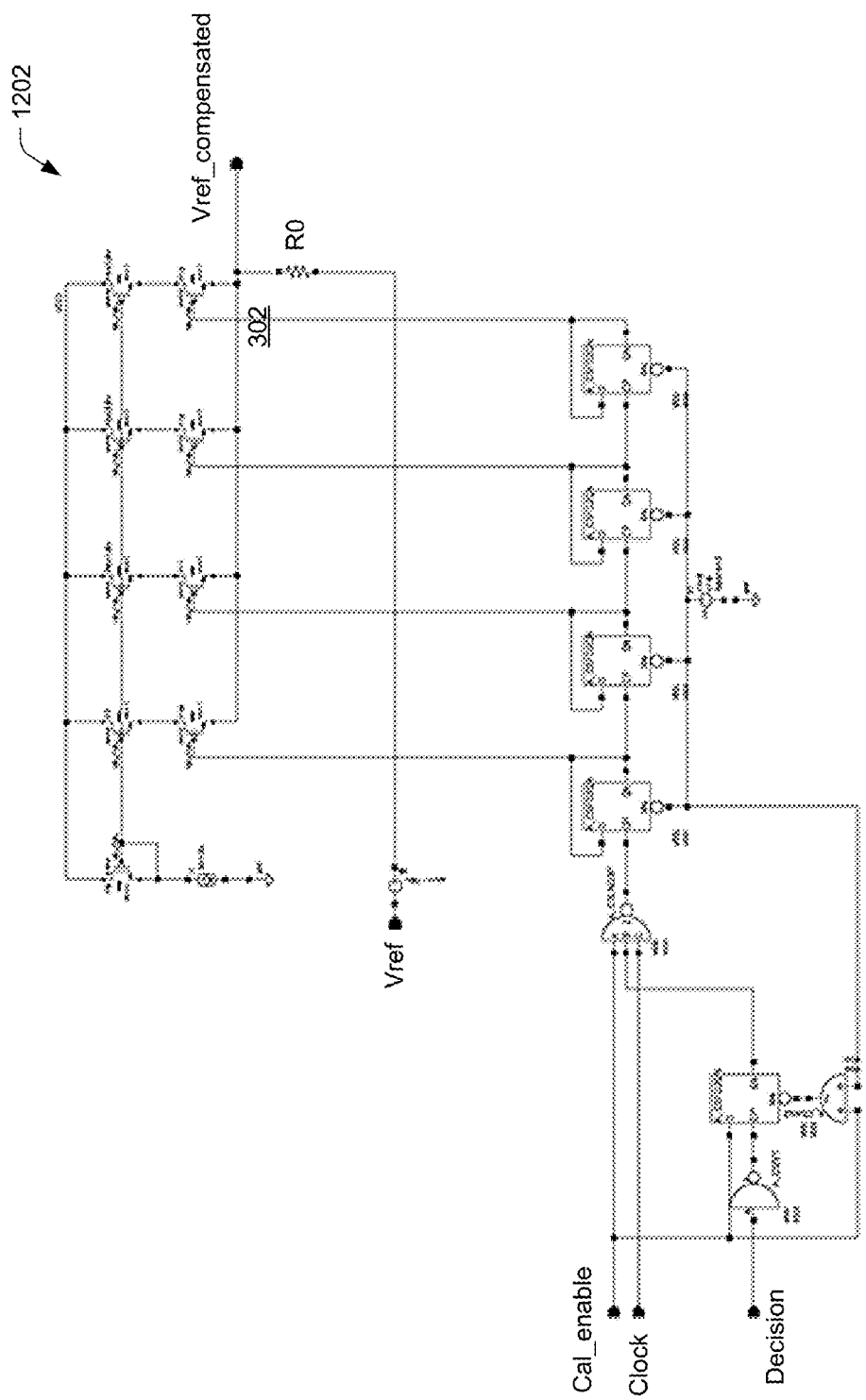
FIG. 14 is a schematic diagram of one example implementation of a calibration circuit.

FIG. 14 is a schematic diagram of one example implementation of a calibration circuit 1202 of FIG. 12. In the implementation, the calibration is performed digitally. A plurality of digitally controlled current sources is used to implement the variable voltage offset, Vref_compensated, used to compensate the offset voltage due to the drift of the op-amp 104. In the example illustrated in FIG. 14, the variable current is passed through the resistor RO to convert the current to voltage. In an example implementation, the calibration range is approximately from 1.5V to 1.7V, while Vref is 1.65V. In other implementations, the calibration range and the Vref value may be different to accommodate the application. Further, the arrangement of the example circuit 1202 is not intended to be limiting, and other digitally controlled current or voltage sources may be used in like manner to generate the Vref_compensated signal.

Figure 15:
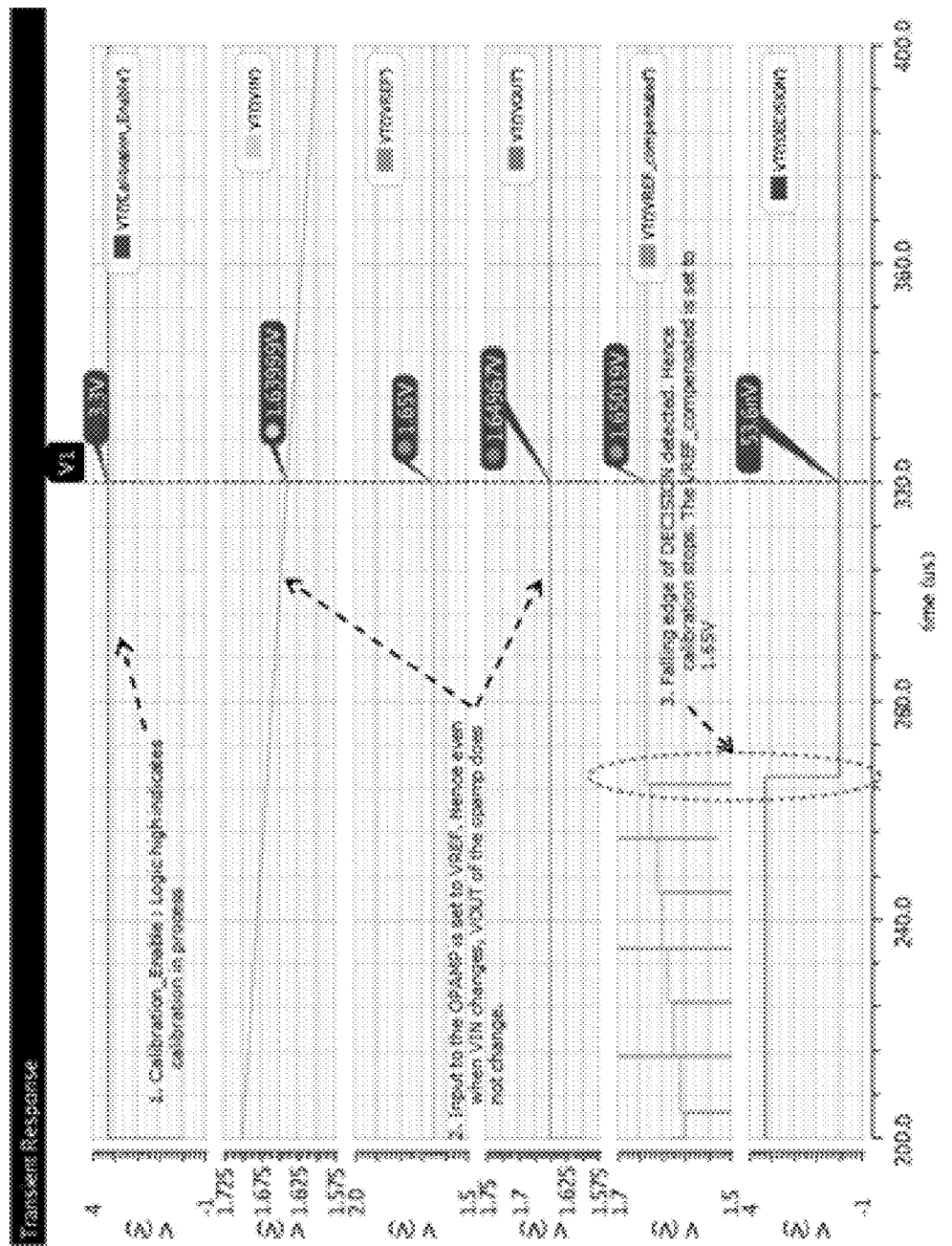
FIG. 15 is a graphical illustration of a set of waveforms illustrating a voltage response at various nodes of the circuit of FIG. 12.

In an implementation, the Vref_compensated signal will sweep from low to high (as shown in FIG. 15). The Vref_compensated signal will stop sweeping when a falling edge of the decision signal is detected. The Vref_compensated signal will remain at the level which the calibration stops (when the change of state of the decision signal is detected). In one implementation, the Vref_compensated signal sweep will reset to the lowest threshold, and begin the sweep again if it reaches a maximum count.

FIGS. 15-18 are graphical illustrations of a set of waveforms illustrating a voltage response at various nodes of the circuit 1000 of FIG. 12. FIG. 15 represents an initial start-up state of the circuit 1000, according to an implementation. During the initial start-up, the Vref_compensated signal is calibrated. The input offset of the op-amp 104 is set to 0V. Hence, the Vref_compensated signal is calibrated to 1.65V as shown in FIG. 15.

Figure 16:
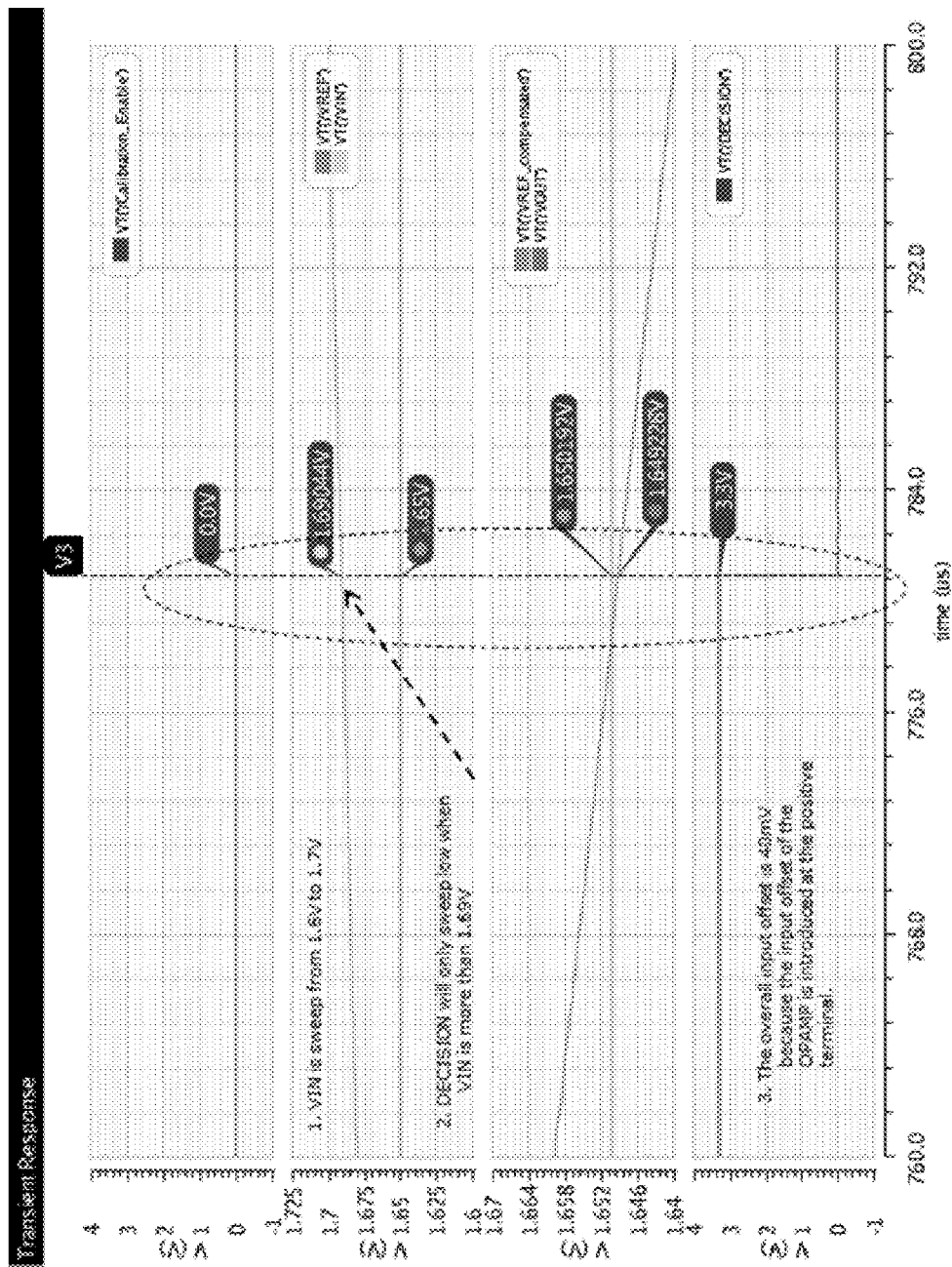
FIG. 16 is a graphical illustration of a set of waveforms illustrating a voltage response at various nodes of the circuit of FIG. 12.

FIG. 16 represents a pre-calibration state of the circuit, according to an implementation. The waveforms show an aging effect on the Vin, with the Vin voltage rising from 1.64V (as seen in FIG. 15) to 1.69V, as shown in FIG. 16. As a result of the Vin drift, the decision signal will not change state to logic low unless Vin is 1.69V or greater.

Figure 17:
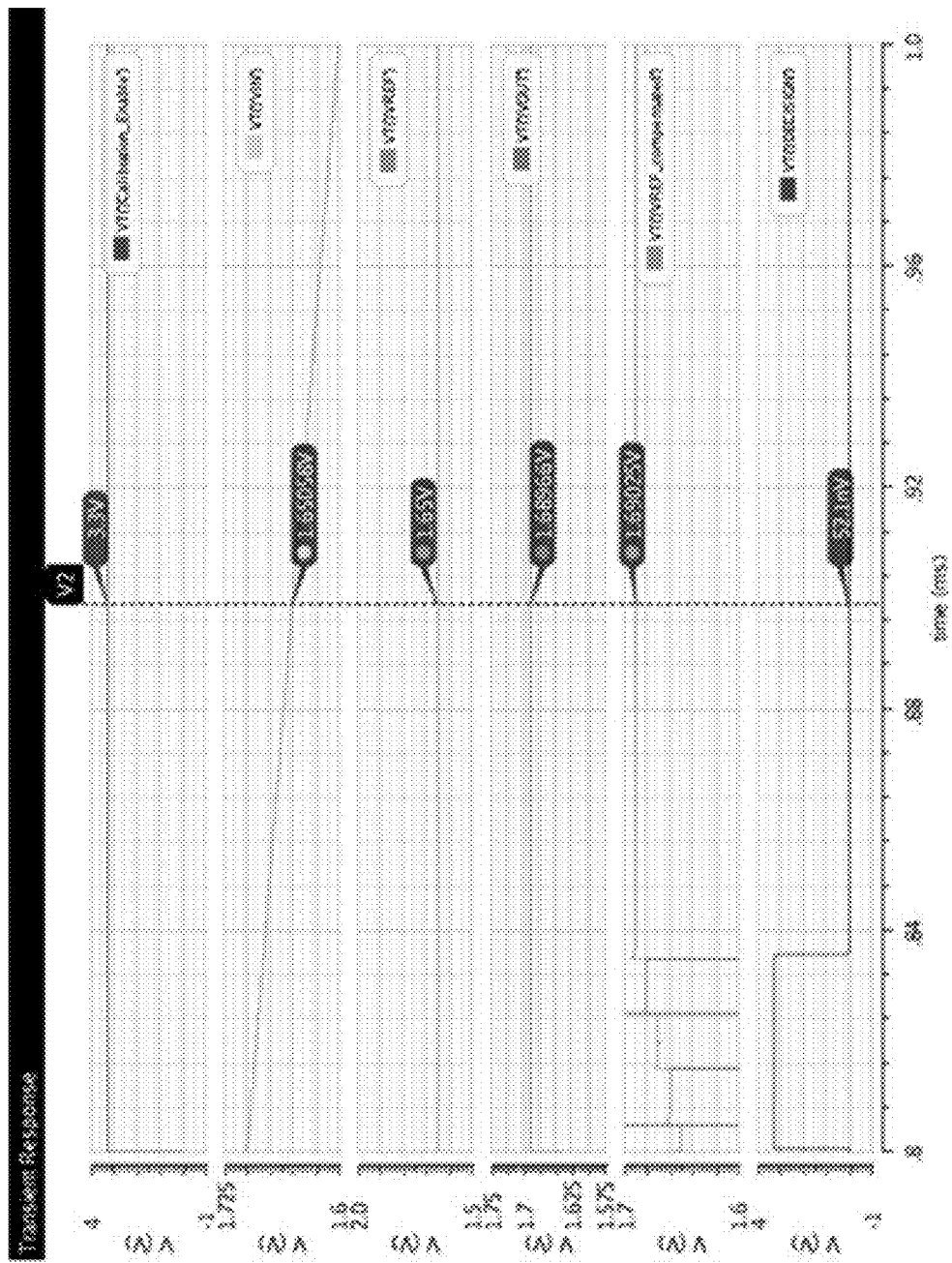
FIG. 17 is a graphical illustration of a set of waveforms illustrating a voltage response at various nodes of the circuit of FIG. 12.

FIG. 17 represents a calibration of the circuit 1000, according to an implementation, based on the offset detected of the Vin signal. To calibrate the circuit 100, the Vref_compensated signal is set to 1.69V, as shown in FIG. 17. In an implementation, setting the Vref_compensated signal to the higher value (1.69V) restores the logical decision voltage level of the comparison circuit 302 via the compensation voltage to the pre-drift level of 1.65V.

Figure 18:
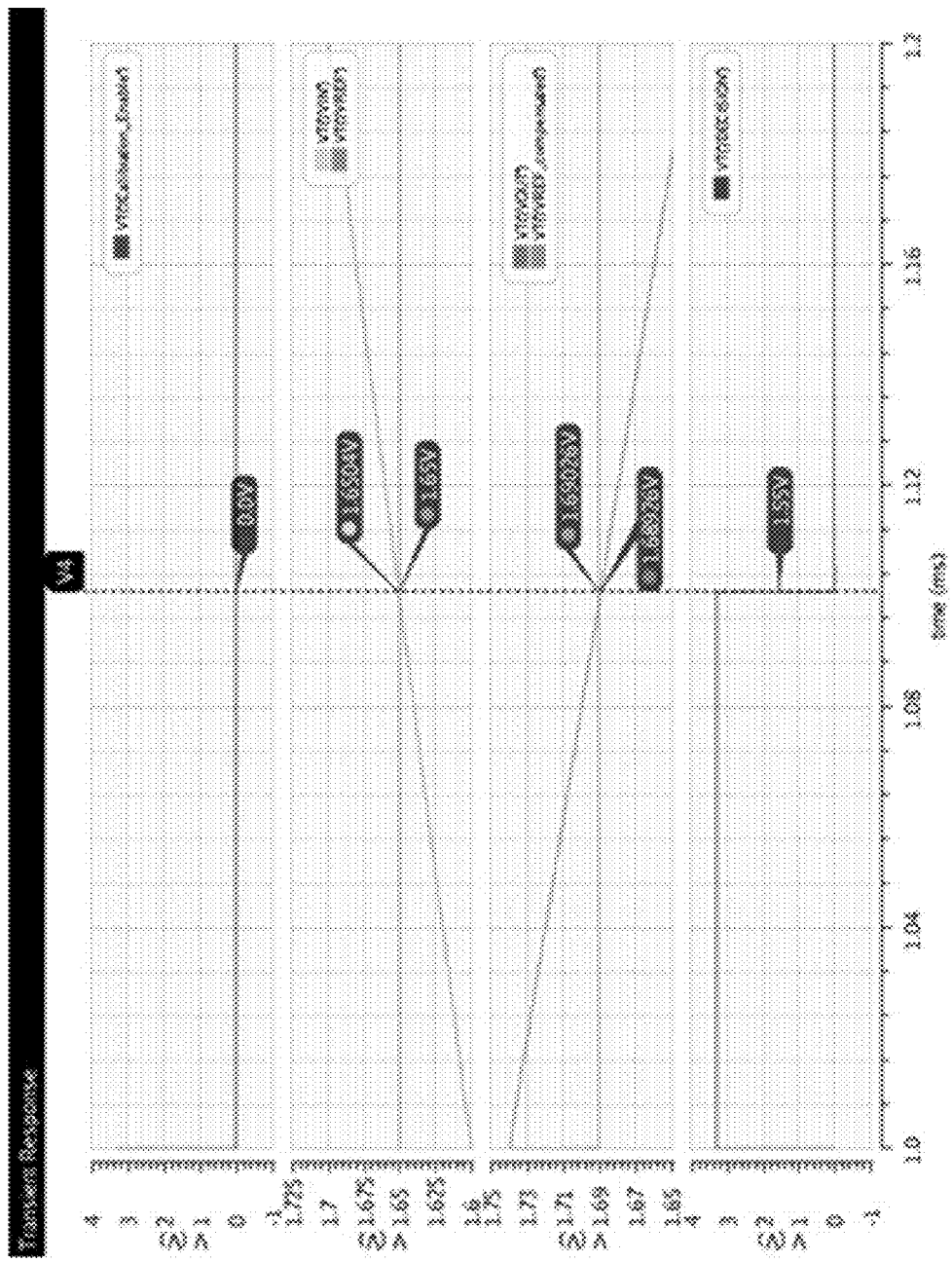
FIG. 18 is a graphical illustration of a set of waveforms illustrating a voltage response at various nodes of the circuit of FIG. 12.

FIG. 18 represents a normal operational state of the circuit 1000 after calibration, according to an implementation. As shown in FIG. 18, after the calibration, the system input offset is reduced from 40 mV to less than 1 mV. With the calibration, the maximum offset due to aging (or other cause) can be reduced to +/−5 mV. This is dependent on the resolution of the calibration circuit 1202, for example. The offset may be further improved with a calibration circuit 1202 having smaller steps, if desired.

The techniques, components, and devices described herein with respect to the example circuit 1000 are not limited to the illustrations of FIGS. 7-14, and may be applied to other circuits, structures, devices, and designs without departing from the scope of the disclosure. In some cases, additional or alternative components may be used to implement the techniques described herein. Further, the components may be arranged and/or combined in various combinations, while remaining within the scope of the disclosure. It is to be understood that an arrangement 1000, or the like, may be implemented as a stand-alone device or as part of another system (e.g., integrated with other components, systems, etc.).

Representative Process

Figure 19:
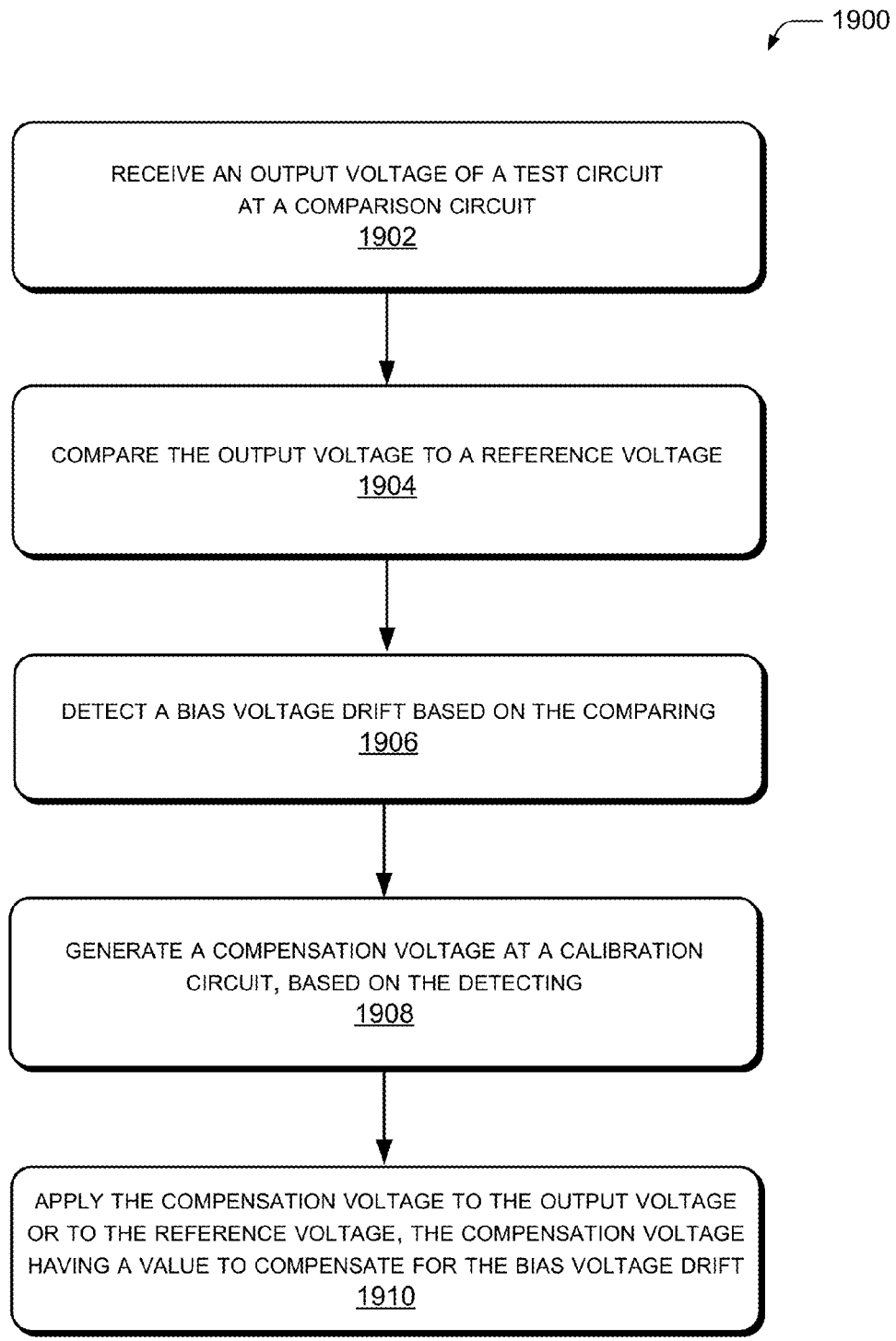
FIG. 19 is a flow diagram illustrating an example process for detecting and compensating for a voltage drift, according to an implementation.

FIG. 19 is a flow diagram illustrating an example process 1900 for detecting and/or compensating for voltage drift, according to an implementation. The process 1900 describes using one or more detection techniques and components to detect the occurrence of voltage drift. In some implementations, the process includes automatically calibrating a system when voltage drift is detected within the system. The process 1900 is described with reference to FIGS. 1-18.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable materials, or combinations thereof, without departing from the scope of the subject matter described herein.

At block 1902, the process includes receiving an output voltage of a test circuit (such as op-amp 104, for example) at a comparison circuit (such as comparison circuit 302, for example). For example, a circuit or device that is monitored for voltage drift or offset due to aging, etc. may be referred to herein as a test circuit. In an implementation, the process includes storing a current (or previous) logical output state of the comparison circuit in a memory storage device prior to commencing a calibration of the test circuit. In the implementation, storing the decision value allows the test circuit to operate normally during calibration.

At block 1904, the process includes comparing the output voltage of the test circuit to a reference voltage. At block 1906, the process includes detecting a bias voltage drift based on the comparing. For example, a detection circuit, comparison circuit, or the like may detecting the bias voltage drift.

In an implementation, the process includes forcing an input of the test circuit to a known voltage while comparing the output voltage to the reference voltage to detect a voltage difference indicating the bias voltage drift. For example, the known voltage may comprise the reference voltage or a voltage proportional to the reference voltage. In the implementation, forcing the input to a known voltage makes the output of the test circuit predictable, for ease of comparison and offset/drift detection.

In another implementation, the process includes forcing a gain of the test circuit to a known gain value while comparing the output voltage to the reference voltage to detect a voltage difference indicating the bias voltage drift. For example, the test circuit may be forced to have a unity gain. In the implementation, forcing the input to a known gain, such as unity gain, makes the output of the test circuit predictable, for ease of comparison and offset/drift detection.

At block 1908, the process includes generating a compensation voltage at a calibration circuit (such as circuits 704 or 1202, for example), based on the detecting. In an implementation, the process includes receiving a logical decision signal from the comparison circuit, and generating the compensation voltage based on a change of a logical state of the decision signal. In another implementation, the process includes outputting a warning signal when the compensation voltage is more than a predetermined calibrated range.

At block 1910, the process includes applying the compensation voltage to the output voltage of the test circuit or to the reference voltage. In an implementation, the compensation voltage has a value to compensate for the bias voltage drift. In either case, the application of the compensation voltage has the result that the logical decision level of the comparison circuit is operational at its pre-drift level. Accordingly, in an implementation, the process includes restoring the logical decision voltage level of the comparison circuit to a predetermined value by applying the compensation voltage to the output voltage or to the reference voltage.

In another implementation, the process includes automatically enabling a calibration of the test circuit at a user-defined interval during normal operation of the test circuit and disabling the calibration when a logical decision signal from the comparison circuit equals a predetermined voltage value.

In alternate implementations, other techniques may be included in the process in various combinations, and remain within the scope of the disclosure.

Conclusion

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. An apparatus, comprising:
    a test circuit configured to:
        receive a reference voltage; and
        output, based on the reference voltage, an output voltage;
    a calibration circuit configured to:
        apply a compensation voltage to the reference voltage to generate a compensated reference voltage; and
        output the compensated reference voltage; and
    a comparison circuit configured to:
        receive the output voltage of the test circuit;
        receive, from the calibration circuit, the compensated reference voltage;
        compare the output voltage of the test circuit to the compensated reference voltage; and
        output, based on the comparison, a decision signal,
    wherein the calibration circuit is further configured to modify, based on the decision signal, the compensation voltage, and
    wherein the compensation voltage has a value to compensate for a bias voltage drift of the test circuit and the comparison circuit.

2. The apparatus of claim 1, wherein the calibration circuit is arranged to restore a logical decision voltage level of the comparison circuit via the compensation voltage.

3. The apparatus of claim 1, wherein the comparison circuit comprises a comparator or an analog to digital converter (ADC).

4. The apparatus of claim 1, wherein the calibration circuit is arranged to receive the decision signal from the comparison circuit, and to modify the compensation voltage based on a change of a logical state of the decision signal.

5. The apparatus of claim 1, wherein the calibration circuit is arranged to generate a varying voltage that sweeps from a first voltage value through successively higher voltage values until a logical state change is detected from an output of the comparison circuit, a voltage value of the varying voltage at the detection of the logical state change comprising the compensation voltage.

6. The apparatus of claim 1, wherein the calibration circuit comprises a plurality of current sources controlled by digital logic.

7. The apparatus of claim 1, wherein the calibration circuit is arranged to output a warning signal when the compensation voltage is greater than a predefined calibrated range.

8. The apparatus of claim 1, wherein the apparatus is arranged to determine the bias voltage drift based on a voltage difference of the output voltage of the test circuit when a known input voltage is applied to the test circuit.

9. The apparatus of claim 1, wherein the apparatus is arranged to automatically correct for a detected bias voltage drift at user-defined intervals of normal operation of the test circuit.

10. A system, comprising:
    a test circuit configured to:

receive a reference voltage; and
output, based on the reference voltage, an output voltage;
a calibration circuit configured to:
apply a compensation voltage to the reference voltage to generate a compensated reference voltage; and
output the compensated reference voltage; and
a comparison circuit configured to:
receive the output voltage of the test circuit;
receive, from the calibration circuit, the compensated reference voltage;
compare the output voltage of the test circuit to the compensated reference voltage; and
output, based on the comparison, a decision signal,
wherein the calibration circuit is further configured to modify, based on the decision signal, the compensation voltage, and
wherein the compensation voltage compensates for a voltage drift of the test circuit and the comparison circuit.

11. The system of claim 10, further comprising a memory storage register arranged to store a current logical output state of the comparison circuit prior to commencing a calibration of the test circuit, allowing the test circuit to operate normally during calibration.

12. The system of claim 10, wherein the calibration circuit is arranged to calibrate the compensation voltage to an initial voltage value during initial start-up of the test circuit, the compensation voltage having a voltage value to determine a preselected logical decision voltage level for the decision signal to change logical states.

13. The system of claim 10, wherein the calibration circuit is arranged to generate a series of voltage values that vary from a first voltage value through successively higher voltage values until the decision signal changes logical states, at which voltage value the compensation voltage is set.

14. The system of claim 10, wherein the calibration circuit is arranged to reset the compensated reference voltage when the output voltage of the test circuit is greater than the compensated reference voltage and the decision signal changes state to a logical high.

15. The system of claim 10, wherein the calibration circuit comprises a digital calibration circuit having a plurality of current sources arranged to generate a variable voltage offset comprising the compensation voltage via at least one resistance.

16. A method, comprising:
receiving an output voltage of a test circuit at a comparison circuit, the output voltage being based on a reference voltage;
applying a compensation voltage to the reference voltage to generate a compensated reference voltage;
comparing the output voltage to the compensated reference voltage;
detecting a bias voltage drift of the test circuit based on the comparing; and
modifying the compensation voltage at a calibration circuit, based on the detecting.

17. The method of claim 16, further comprising:
receiving a logical decision signal from the comparison circuit; and
modifying the compensation voltage based on a change of a logical state of the decision signal.

18. The method of claim 16, further comprising restoring a logical decision voltage level of the comparison circuit to a predetermined value by applying the compensation voltage to the reference voltage.

19. The method of claim 16, further comprising storing a current logical output state of the comparison circuit in a memory storage device prior to commencing a calibration of the test circuit, allowing the test circuit to operate normally during calibration.

20. The method of claim 16, further comprising forcing an input of the test circuit to a known voltage while comparing the output voltage to the compensated reference voltage to detect a voltage difference indicating the bias voltage drift.

21. The method of claim 20, wherein the known voltage comprises the reference voltage or a voltage proportional to the reference voltage.

22. The method of claim 16, further comprising forcing a gain of the test circuit to a known gain value while comparing the output voltage to the compensated reference voltage to detect a voltage difference indicating the bias voltage drift.

23. The method of claim 16, further comprising automatically enabling a calibration of the test circuit at a user-defined interval during normal operation of the test circuit and disabling the calibration when a logical decision signal from the comparison circuit equals a predetermined voltage value.

24. The method of claim 16, further comprising outputting a warning signal when the compensation voltage is more than a predetermined calibrated range.

25. A system, comprising:
an operational amplifier configured to:
receive a reference voltage; and
output an output voltage while the operational amplifier is forced to unity gain;
a digital calibration circuit configured to:
apply a compensation voltage to the reference voltage to generate a compensated reference voltage; and
output the compensated reference voltage; and
a comparator configured to:
receive the output voltage of the operational amplifier;
receive, from the digital calibration circuit, the compensated reference voltage;
compare the output voltage of the operation amplifier to the compensated reference voltage to detect a voltage drift of the operational amplifier; and
output a decision signal when the output voltage is greater than the compensated reference voltage,
wherein the digital calibration circuit is further configured to:
receive the decision signal; and
modify the compensation voltage based on the detected voltage drift, and
wherein the compensation voltage has a voltage value to compensate for the detected voltage drift of the operational amplifier.

* * * * *